(12) United States Patent
Dupont

(10) Patent No.: US 8,426,815 B2
(45) Date of Patent: Apr. 23, 2013

(54) BOLOMETER PIXEL PROVIDED WITH A MIM INTEGRATION CAPACITOR

(75) Inventor: Bertrand Dupont, Gargas (FR)

(73) Assignee: Commissariat a l'Energie Atomique, Paris (FR)

( * ) Notice: Subject to any disclaimer, the term of this patent is extended or adjusted under 35 U.S.C. 154(b) by 518 days.

(21) Appl. No.: 12/720,340

(22) Filed: Mar. 9, 2010

(65) Prior Publication Data

US 2010/0243892 A1  Sep. 30, 2010

(30) Foreign Application Priority Data

Mar. 31, 2009 (FR) .................................... 09 52033

(51) Int. Cl.
  *G01J 5/00* (2006.01)
  *G01J 5/02* (2006.01)
  *G01J 5/12* (2006.01)
(52) U.S. Cl.
  USPC .................. 250/338.1; 250/332; 257/303
(58) Field of Classification Search ............... 250/338.1, 250/332, 349, 338.4, 200; 257/758, 303
  See application file for complete search history.

(56) References Cited

U.S. PATENT DOCUMENTS

| | | | |
|---|---|---|---|
| 5,021,663 | A | 6/1991 | Hornbeck |
| 2004/0212001 | A1 | 10/2004 | Yamamoto |
| 2005/0218520 | A1 | 10/2005 | Kikuta et al. |
| 2007/0262256 | A1* | 11/2007 | Lee .............................. 250/338.1 |

\* cited by examiner

*Primary Examiner* — David Porta
*Assistant Examiner* — Yara Green
(74) *Attorney, Agent, or Firm* — Oblon, Spivak, McClelland, Maier & Neustadt, L.L.P.

(57) ABSTRACT

A thermal imaging microelectronic device including: a support, a plurality of metal levels for interconnecting electronic components formed on the support, an array of thermal detectors formed on the support, each detector including a membrane with which radiant energy may be absorbed and one or more electric signals may be provided depending on the absorbed radiant energy, and a readout circuit that reads out the electric signals from the membrane, the readout circuit being integrated to the support, and at least several of the detectors having a readout circuit provided with an integrator including at least one integration capacitor disposed facing the membrane, the capacitor having at least one upper plate made in a given interconnection metal level of the plurality of interconnection metal levels.

6 Claims, 3 Drawing Sheets

BOLOMETER PIXEL PROVIDED WITH A MIM INTEGRATION CAPACITOR

TECHNICAL FIELD

The invention relates to the field of devices for detecting electromagnetic radiations, in particular those based on the heat detection principle, such as bolometers.

Provision is made for a thermal image sensor, for example used in the field of infrared imaging, and formed with an array of cells or pixels including a bolometer sensor associated with a readout circuit having an improved layout.

It provides improvements in terms of integration density and of quality of the signal at the output of the readout circuit.

PRIOR ART

Figure 1:
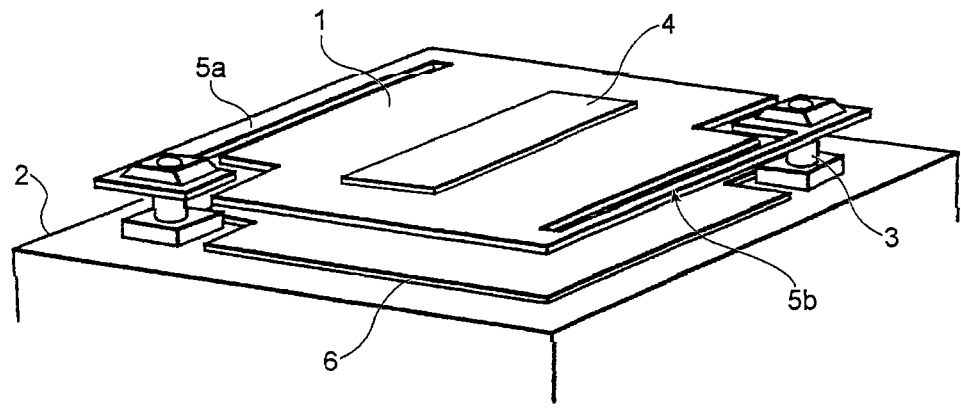

A layout example of a bolometer sensor is given in FIG. 1.

This device first of all comprises an absorbent membrane 1 with regard to incident electromagnetic radiations. This membrane 1 is suspended above a support 2 via electrically conducting mounts 3.

Under the effect of electromagnetic radiation, the membrane 1 is capable of heating up and of transmitting its temperature to a layer 4, which may be semiconducting and for example comprise one or more thermistors with which radiant energy may be transformed into a measurement electric signal.

The support 2 may be an upper layer of a microelectronic device comprising one or more integrated circuits, and in particular at least one circuit for reading out the conducted measurements.

The detector may further comprise arms 5a, 5b, each provided with an end connected to the membrane 1 and another end connected to the anchoring mounts 3, and by which the membrane 1 is maintained suspended above the support 2. On a major portion of their length, the arms 5a, 5b are spaced apart from the membrane 1 so as to limit thermal losses of the membrane and to thereby improve the sensitivity of the detector.

A layer 6 reflecting electromagnetic radiations may be placed on the support 2, facing the membrane 1. The distance between this layer 6 and the membrane 1 is dictated by the height of the anchoring mounts 3. This distance may be equal to the quarter of the detected wavelength in order to create a quarter wavelength cavity by which the absorption of the membrane may be increased.

A thermal image sensor is generally formed with an array of X×Y pixels or elementary cells each provided with a detector as described in connection with FIG. 1.

Thus, in infrared imaging, an imager is used, comprising an array of pixels for sensing the infrared flux, with one bolometer per pixel in order to produce an infrared image of a scene, i.e. a surface covered during the recording of an image and the size of which results from the observation conditions and from the properties of the sensor used.

A bolometer operates as a resistive sensor, the resistance of which varies with temperature and therefore with the radiation flux from the scene. In order to read the value of the resistance of the bolometer which corresponds to an infrared flux, for example a voltage may be imposed and a current may be measured.

Figure 2:
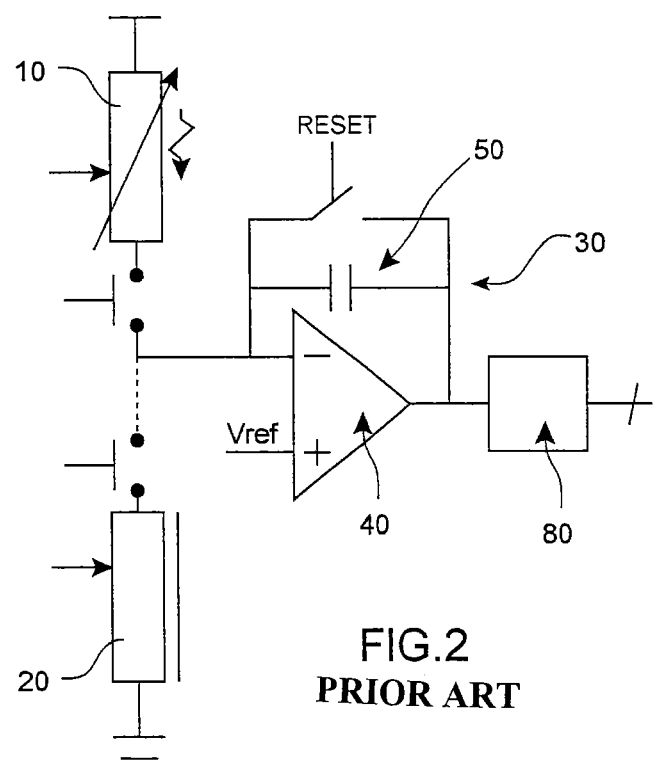

An electric diagram of a bolometer sensor cell and of its associated readout circuit is given in FIG. 2.

In this device, a current of a predetermined set value, for example a value close to the average value of the current on the sensor is subtracted from the current originating from a detector 10.

This current with a set value stems from a source with a set current, which may be formed for example with a reference bolometer 20 insensitive or made insensitive to the observed radiation. Reference bolometers may be provided for example at the bottom of a column or at the head of the line of an array of pixels.

Thus, it is sought to obtain a current to be integrated, as small as possible, and which corresponds to the variations of the resistance of the sensitive bolometer under the effect of the electromagnetic radiation flux from the scene.

The current originating from the difference between the current from the sensitive bolometer and the current from the reference bolometer is converted into a voltage by means of an integrator 30, which may be formed with a comparator 40 and an integration capacitor 50 with capacitance Cint located between an inverting input and the output of the comparator 40.

Sampling means 80 may be provided at the output of the integrator 30.

The integration of a reference bolometer within a sensitive pixel poses problems of bulkiness, consumption and detection accuracy.

In image array sensors with bolometers, the integration capacitors as well as the comparator 40 are generally located at the bottom of a column.

Figure 3:
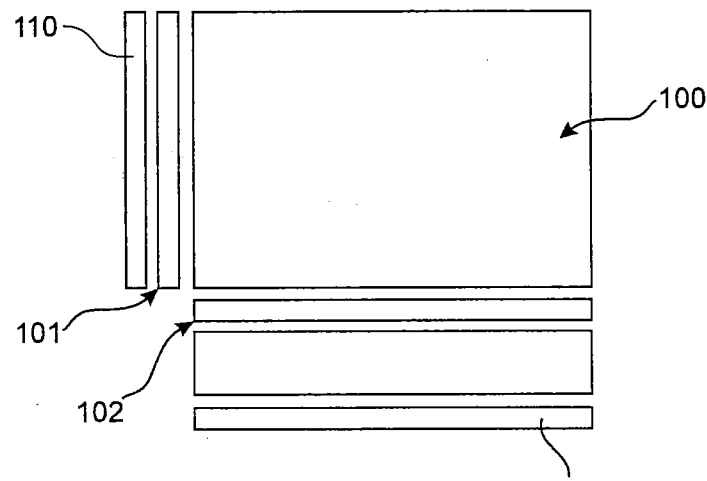

In FIG. 3, an exemplary layout of a thermal imaging device according to the prior art is given.

The device comprises an array 100 of sensitive bolometer sensors, a first set 101 and a second set 102 of reference sensors made insensitive to the observed radiation, laid out along the array, as well as a circuit 110 for addressing the lines of the array 100, and a circuit 120 for addressing the columns of the array. The integration capacitors of the readout circuits are generally arranged outside the array of sensitive sensors, at the bottom of a column for example between the set 102 of reference sensors and the column addressing circuit 120.

Some sensors dedicated to the non-cooled IR imagers are not very resistive and have very low response to the scene. It is therefore necessary to strongly bias them in order to have a satisfactory signal-to-noise ratio.

With some technologies and when significant currents have to be integrated, a situation is reached wherein the required surface area for integrating the capacitors at the bottom of a column may become greater than the sensitive area of the array.

Document U.S. Pat. No. 5,021,663 discloses a thermal imager microelectronic device comprising: a plurality of metal levels for interconnecting electronic components formed on a support, as well as an array of thermal detectors formed on the support, each detector including a membrane with which radiant energy may be absorbed and one or more electric signals depending on the absorbed radiant energy may be provided, and means for reading out the electric signals stemming from the membrane.

The problem is posed of finding a new detection device, which has improvements notably in terms of bulkiness.

DISCUSSION OF THE INVENTION

The invention first of all relates to an imaging microelectronic device with thermal detection comprising:

a support, a plurality of metal levels for interconnecting electronic components formed on the support, an array of thermal detectors formed on the support, each detector including a membrane with which radiant energy may be absorbed and one or more electric signals may be provided depending on the absorbed radiant energy, and means for reading out the electric signals stemming from the membrane, the reading means being integrated to the support, at least several of said detectors having readout means provided with an integrator comprising at least one integration capacitor formed facing the membrane, the capacitor having at least one upper plate made in a given interconnection metal level of said plurality of interconnection metal levels.

Because of the arrangement of the integration capacitor facing the membrane, the device has reduced bulkiness.

As compared with a device in which the integration capacitors are located at the bottom of a column, a significant gain in space may be obtained.

The MIM capacitor may have its lower plate made in another one of said interconnection metal levels.

The upper plate may be connected to one or more vertical interconnection conducting members or vias with which a connection may be established with a readout circuit.

One of the plates may be shared by detectors of a same row of detectors of the array.

When at least one of the plates of the integration capacitor covers a whole column of the array, this plate may be used for circulating the information as a current from a detector.

The upper plate may be shared by the detectors of a same row of detectors of the array.

In order to avoid any coupling which may degrade the signal, it is thereby possible to have the signal pass in transit on the furthest plate from the substrate on which the different interconnection metal levels have been made.

SHORT DESCRIPTION OF THE DRAWINGS

Figure 4:
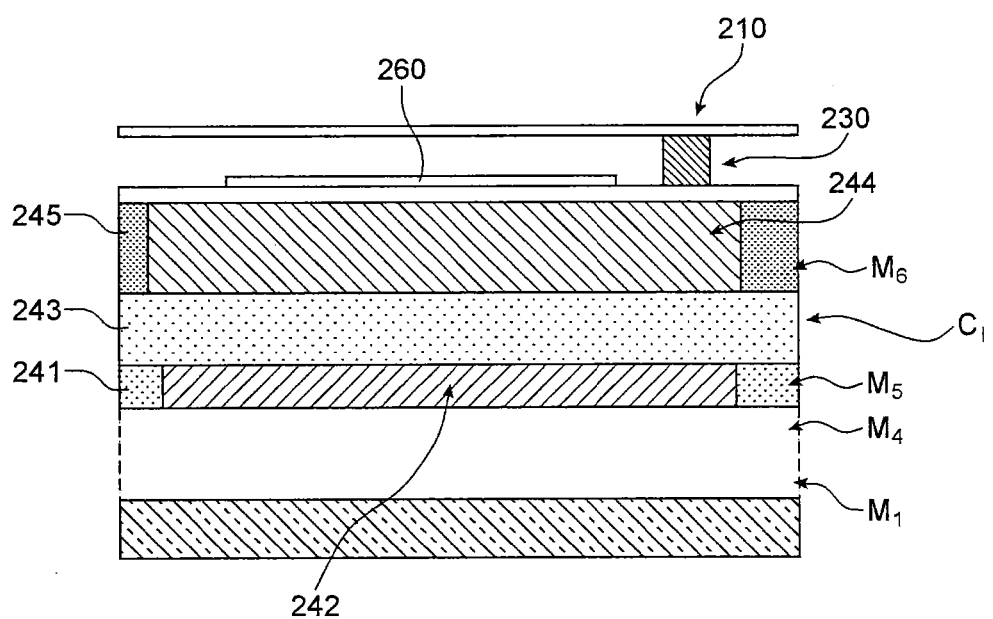
Figure 5:
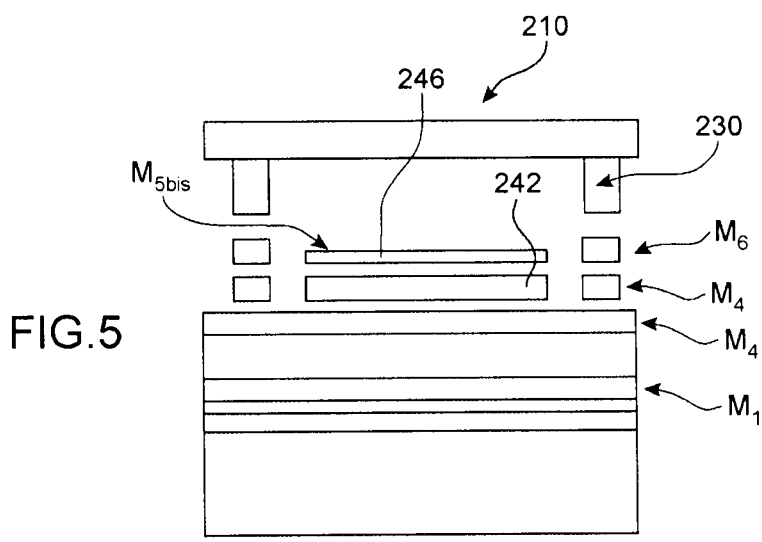
Figure 6:
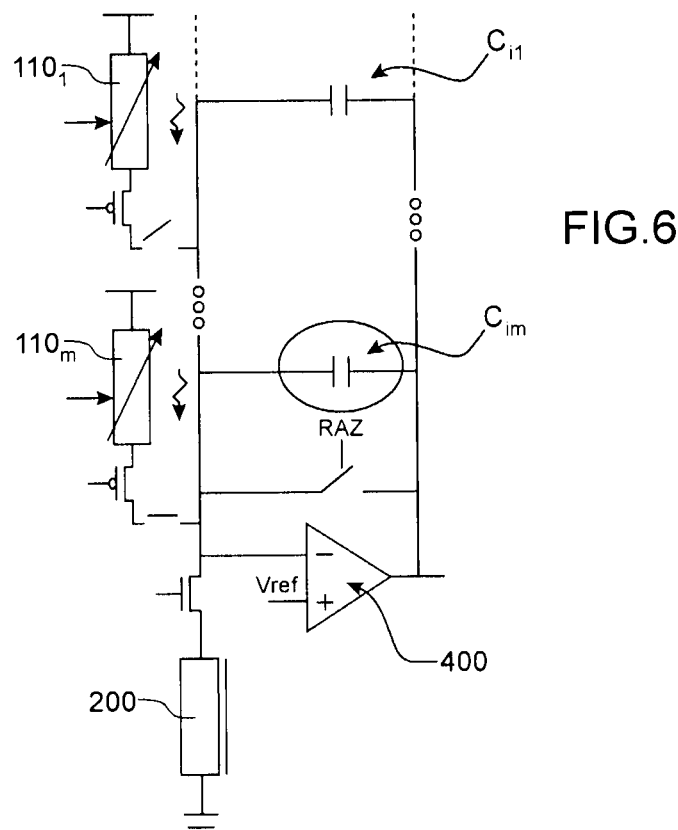

The present invention will be better understood upon reading the description of given exemplary embodiments, purely as an indication and by no means as a limitation, with reference to the appended drawings wherein:

FIG. 1 illustrates an exemplary thermal bolometer detector according to the prior art, FIG. 2 illustrates an exemplary layout, according to the prior art, of a bolometer sensor and of its associated readout circuit, FIG. 3 illustrates a layout according to the prior art, of a microelectronic device comprising an array of bolometer sensors, and in particular integration capacitors of the associated readout circuits according to the prior art, FIG. 4 illustrates an exemplary microelectronic device comprising an array of sensors with bolometers according to the invention, wherein each bolometer sensor comprises a MIM integration capacitor formed facing a bolometer detector, FIG. 5 illustrates another exemplary microelectronic device comprising an array of sensors with bolometers according to the invention, wherein each bolometer sensor comprises a MIM integration capacitor formed facing a bolometer detector, FIG. 6 illustrates an exemplary microelectronic device comprising an array of cells provided with sensors with bolometers, wherein each cell comprises a MIM integration capacitor formed facing a bolometer detector.

Identical, similar or equivalent parts of the different figures bear the same numerical references so as to facilitate passing from one figure to the next.

The different parts illustrated in the figures are not necessarily illustrated according to a uniform scale, in order to make the figures more legible.

DETAILED DISCUSSION OF PARTICULAR EMBODIMENTS

An exemplary microelectronic device according to the invention, provided with a bolometer sensor is given in FIG. 4.

This device comprises a substrate 201, for example a semiconducting substrate or a semiconducting substrate on an insulator such as an SOI (silicon on insulator) substrate, on which a plurality of electronic components and of superposed interconnection metal levels are formed.

The device may include k (with k a non-zero integer) superposed interconnection metal levels, each level comprising one or more horizontal conducting lines parallel to the substrate 201 and one or more vertical interconnection members, commonly called "vias" providing the connection of the conducting lines of different levels with each other.

In the example of FIG. 4, the device includes k=6 interconnection metal levels M1, M2, M3, M4, M5, M6 (the components and the first 3 interconnection metal levels M1, ..., M4, being schematically illustrated by a block with dashed lines above the substrate 201).

The sensitive portion of the bolometer sensor may have a layout like the one described earlier in connection with FIG. 1 and be provided with a membrane 210 placed above a stack of layers resting on the support 201. The membrane 210 is suspended above the support 200 which is formed with a stack of layers resting on the substrate 201, and in which the plurality of interconnection levels have notably been made.

Conductive mounts 230 are used both for maintaining the membrane above the substrate and for conveying electric signals from the membrane and which are representative of detected thermal energy.

A reflective layer 260 for electromagnetic radiations may be provided on the stack, opposite the membrane 210. The distance between this layer 260 and the membrane 210 is dictated by the height of the conducting mounts 230, and may be provided depending on the wavelength of the detected radiation.

The capacitor $C_I$ is a MIM (Metal Insulator Metal) capacitor, the upper plate 244 of which is formed in a given interconnection metal level, for example in the last interconnection metal level M6, i.e. the level the farthest away from the substrate 201.

According to an alternative (FIG. 5), the capacitor $C_I$ is provided with an upper plate 246 formed in an interconnection metal level M5bis, i.e. a metal level which is located between the metal level M5 and the last metal level M6, the level the farthest away from the substrate 201, the interconnection metal level M5bis being connected to the last level M6.

The lower plate 242 may be formed in another interconnection metal level, for example in the last but one interconnection metal level M5.

The upper plate 244 and the lower plate 242 may be in the form of metal layers made in insulating layers 245 and 241 respectively.

The upper 244 and lower 242 plates may be formed for example, on the basis of copper or aluminium, and separated from each other by an insulating layer 243 which may for example be based on $SiO_2$.

The upper plate 244 of the integration capacitor $C_I$ may be connected to a comparator (not shown) for example at the inverting input of the comparator, while the lower plate 244 is connected to the output of the comparator.

In FIGS. 4 and 5, only one cell or pixel of a thermal detector microelectronic device is illustrated. Such a device comprises a plurality of bolometer sensors laid out according to an array and associated readout means or circuits also arranged as an array facing the array of bolometer sensors.

According to a possible embodiment (not shown), the integration capacitor $C_I$ may be formed with several capacitors mounted in parallel, for example 3 capacitors mounted in parallel.

In this case, the capacitors mounted in parallel may each be provided with an upper plate formed in the last metal level M6, which may be connected to at least one other upper plate of another capacitor formed in the last metal level M6, and each with a lower plate which may be formed in the last but one metal level M5, and which may be connected to at least one other lower plate of another capacitor formed in the last but one metal level M5.

According to a possible embodiment, the upper plate 244 of the integration capacitor may belong to a metal track which may be shared by several cells and possibly by all the cells of a same column of the array.

The lower plate 242 of the integration capacitor $C_I$ may also belong to another metal track which may be shared by several cells and possibly by all the cells of a same column of the array.

In the case when the upper metal plate 244 of the integration capacitor belongs to a metal track shared by the cells of a same column of the array, this plate may further be used for forwarding the signal from a bolometer sensor and may act as a column bus. By forwarding the signal through the plate the farthest away from the substrate 201 and the components formed on the latter, coupling phenomena are limited.

Such a layout is for example given in FIG. 6, in which bolometer detectors $110_1, \ldots, 110_m$ belonging to cells of a same column of an array device, are illustrated.

A reference bolometer 200 is provided for example at the bottom of a column, while the current originating from the difference between the current from a sensitive bolometer and the current from the reference bolometer is converted into a voltage by means of an integrator, formed by a comparator 400 and by integration capacitors CI1, ..., CIm mounted in parallel and the plates of which act as a column bus.

The invention claimed is:

1. A thermal imaging microelectronic device comprising:
a support,
a plurality of metal levels for interconnecting electronic components formed on the support,
an array of thermal detectors formed on the support, each detector including a membrane with which radiant energy may be absorbed and one or more electric signals may be provided depending on the absorbed radiant energy, and means for reading out the electric signals from the membrane, the readout means being integrated to the support, and
at least several of said detectors having readout means provided with an integrator comprising at least one integration capacitor disposed facing the membrane, the at least one integration capacitor having at least one upper plate made in a given interconnection metal level of said plurality of interconnection metal levels.

2. The microelectronic device according to claim 1, wherein the at least one integration capacitor has at least one lower plate, disposed in another one of said interconnection metal levels.

3. The microelectronic device according to claim 1, wherein the upper plate is connected to a readout circuit via one or more vertical interconnection members.

4. The microelectronic device according to claim 1, wherein one of the plates is shared by detectors of a same row of detectors of the array.

5. The microelectronic device according to claim 4, wherein the upper plate is shared by the detectors of a same row of detectors of the array.

6. A thermal imaging microelectronic device comprising:
a support,
a plurality of metal levels for interconnecting electronic components formed on the support, an array of thermal detectors formed on the support, each detector including a membrane with which radiant energy may be absorbed and one or more electric signals may be provided depending on the absorbed radiant energy, and a readout circuit that reads out the electric signals from the membrane, the readout circuit being integrated to the support, and
at least several of said detectors having a readout circuit provided with an integrator comprising at least one integration capacitor disposed facing the membrane, the at least one integration capacitor having at least one upper plate made in a given interconnection metal level of said plurality of interconnection metal levels.

* * * * *